(12) United States Patent
Edwards et al.

(10) Patent No.: US 7,965,132 B2
(45) Date of Patent: Jun. 21, 2011

(54) TRANSISTOR OUTPUT CIRCUIT AND METHOD

(75) Inventors: Martin John Edwards, Crawley (GB); Nicola Bramante, Willingham (GB)

(73) Assignee: Chimei Innolux Corporation, Chu-Nan (TW)

( * ) Notice: Subject to any disclaimer, the term of this patent is extended or adjusted under 35 U.S.C. 154(b) by 51 days.

(21) Appl. No.: 12/344,120

(22) Filed: Dec. 24, 2008

(65) Prior Publication Data

US 2009/0167422 A1     Jul. 2, 2009

Related U.S. Application Data

(60) Provisional application No. 61/016,826, filed on Dec. 27, 2007.

(30) Foreign Application Priority Data

Oct. 24, 2008  (EP) .................................... 08167569

(51) Int. Cl.
 *G05F 1/10*  (2006.01)
 *G05F 3/02*  (2006.01)
(52) U.S. Cl. ........... 327/541; 327/94; 327/538; 327/156
(58) Field of Classification Search .................... 327/91, 327/94, 148, 157, 530, 534–538, 540, 541, 327/543; 363/59, 609
See application file for complete search history.

(56) References Cited

U.S. PATENT DOCUMENTS

| 5,684,318 | A | 11/1997 | Ayres et al. | |
|---|---|---|---|---|
| 6,246,555 | B1 | 6/2001 | Tham | |
| 6,819,165 | B2 | 11/2004 | Ho et al. | |
| 7,119,584 | B1 * | 10/2006 | Ali | 327/91 |
| 2005/0030264 | A1 * | 2/2005 | Tsuge et al. | 345/76 |
| 2007/0211535 | A1 * | 9/2007 | Kim | 365/185.21 |
| 2009/0121912 | A1 * | 5/2009 | Zanchi et al. | 341/172 |

FOREIGN PATENT DOCUMENTS

EP       0741391       11/1996

* cited by examiner

*Primary Examiner* — Lincoln Donovan
*Assistant Examiner* — Brandon S Cole
(74) *Attorney, Agent, or Firm* — Liu & Liu

(57) ABSTRACT

A transistor circuit is provided. The transistor circuit includes a first output transistor, a second output transistor, and a switch arrangement. The first and second output transistors are arranged for providing an output signal to a common output of the transistor circuit. The switch arrangement couples an output of the first output transistor and the output of the second output transistor to the common output in sequence. The first and second output transistors are controlled to provide the same steady state output. The switch arrangement is adapted such that when the output of the first output transistor is coupled to the common output, changes in drive conditions voltage of the first output transistor are isolated from the second output transistor.

17 Claims, 5 Drawing Sheets

US 7,965,132 B2

TRANSISTOR OUTPUT CIRCUIT AND METHOD

CROSS REFERENCE TO RELATED APPLICATIONS

This application claims the benefit of European Serial No. 08167569.6 filed Oct. 24, 2008, the subject matter of which is incorporated herein by reference.

The present application claims the benefit of U.S. provisional application Ser. No. 61/016,826, filed Dec. 27, 2007.

BACKGROUND OF THE INVENTION

1. Field of the Invention

This invention relates to transistor output circuits, namely circuits in which an output transistor is used to provide a variable output voltage or current over time. An example of such a circuit is a current sampling circuit, for example that provides a current output in response to a sensing function.

2. Description of the Related Art

In a number of sensing applications, the sensing devices (for example diodes or transistors) generate an output current which depends on the parameter to be sensed. The range of applications in which current sensors can be used is enormous, and this invention can be applied to any such application. For example, the parameter to be sensed can be a light level in the case of a photosensor or a temperature in the case of a temperature sensor. The sensor will measure a physical property such as light, temperature, strain or other forces.

The output current of a sensor will often be very small, and it is advantageous to convert the signal to a more robust form close to the sensor in order to preserve the quality of the signal, particularly the signal to noise ratio. Sampling of the current is required in the case where the signal changes over time or when the output of several sensors is multiplexed together as is the case for an array of sensors.

FIG. 1 shows a known simple sampling circuit.

The current to be sampled may for example comprise a photocurrent, and is represented by a current source CS1. The current is drawn through a p-type drive transistor T1p, which has a capacitor C1 connected between its source and gate. This capacitor can thus store the gate-source voltage corresponding to the current being sampled.

The circuit has a first switch S1 (with timing Clk1) between the gate and drain of the transistor T1p for turning the transistor T1p on so that it can supply the current being sampled. A second switch S2 (with timing Clk2) couples the sampling transistor T1p to the sensor CS1, and a third switch S3 (with timing Clk3) couples the sampling transistor T1p to the output OUT of the sampling circuit.

As shown in FIG. 2, during a sampling phase S, the switches S1 and S2 are closed and the switch S3 is open. The current to be sampled, the photocurrent in this example, is drawn through the transistor T1p. The voltage present on the gate and the drain of the transistor T1p settles at a value which produces a drain current in the transistor T1p which is equal to the photocurrent. This voltage becomes stored across the capacitor C1. During a holding phase H, the switches S1 and S2 are opened and the switch S3 is closed. The gate-source voltage of the transistor T1p is maintained by the capacitor C1 and therefore the sampled photocurrent is available at the output OUT of the circuit.

The time required to sample the current is proportional to $(C1+Cd)/gm1$, wherein Cd is the capacitance of the sensor (i.e. the photodiode) and $gm1$ is the transconductance of the transistor T1p. When the current to be measured is small, the transistor T1p will be operating in the sub-threshold region. In this region, the value of $gm1$ is proportional to the drain current $Id1$. Therefore when the current to be sampled is low, the settling time is extended.

Low temperature polysilicon (LTPS) technology allows CMOS circuits to be integrated on large area substrates and is used to make devices such as active matrix liquid crystal displays. Integration of sensors onto displays is of increasing interest and therefore the design of thin film transistor (TFT) circuits for processing the signals from these sensors is becoming more important. The TFTs within circuits which process the output from the sensing device may be biased close to their threshold voltage or even in the sub-threshold region as explained above, especially when dealing with very small currents, and under these bias conditions, they can demonstrate some undesirable behaviour.

Thin film transistors can exhibit current overshoot or undershoot effects when the bias voltages applied to them are changed. This is illustrated in FIG. 3, which shows schematically how the drain current of a transistor changes when a voltage step is applied to the gate of the device. When the gate-source voltage is switched from a first value VGS1 to a second lower value VGS2, the drain current ID of an n-type TFT initially falls to a lower level but over time increases until it reaches a steady state value. When the gate-source voltage is switched from the lower level VGS2 to the higher level VGS1, the drain current initially increases to a higher level but then decreases over time until it reaches its steady state value. This transient behaviour results from the trapping of carriers within the device, and the magnitude of the transient and the time required for the current to reach its steady state value are such that the performance of circuits using the devices can be significantly affected. This behaviour is most pronounced when the TFT is operating in the sub-threshold region but may also be significant close to the threshold voltage which is typically where devices are biased in analogue circuits.

The magnitude of the transient can be more than 50% and the time required for the current to reach its steady state value can be more than 50 ms. This is much slower than the other transient response times in the circuits, for example derived from capacitor charging times. This transient behaviour therefore can become the dominant cause of errors in the output of a current sampling circuit.

FIG. 4 shows an example of the drain current transient behaviour measured in an n-type LTPS TFT when the gate-source voltage is stepped from 2.5V to 1.0V at t=0 with a drain-source voltage of 2.5V. The drain current initially falls to a value of approximately 0.5 nA but then rises over a period of about 30 ms to a value of 2.3 nA.

In some circuits, the TFTs may experience significant disturbance to their gate voltage in addition to any changes associated with the signal that is being processed. An example of this would be when a node within the circuit has to be pre-charged to a certain voltage level before a signal voltage is applied or generated on the node. These disturbances can trigger the slow transient currents illustrated in FIG. 4 which may in turn produce errors in the output of the circuit.

This problem applies generally when transistors provide a varying output voltage or current, and not only in connection with current sensing applications.

BRIEF SUMMARY OF THE INVENTION

According to the invention, there is provided a transistor circuit, comprising a first output transistor, a second output transistor, and a switch arrangement. The first and second output transistors are arranged for providing an output signal to a common output of the transistor circuit. The switch arrangement couples an output of the first output transistor and the output of the second output transistor to the common output in sequence. The first and second output transistors are controlled to provide the same steady state output. The switch arrangement is adapted such that when the output of the first output transistor is coupled to the common output, changes in drive conditions voltage of the first output transistor are isolated from the second output transistor.

In one example, the circuit is a current sampling circuit. The first output transistor comprises a current sampling transistor for sampling a current. The second output transistor comprises a transistor for delivering a current output, and the second output transistor is coupled in parallel with the first output transistor. The circuit further comprises a first transistor gate-source capacitance. The switch arrangement is for selectively coupling a gate voltage of the first output transistor to a gate of the second output transistor. The switch arrangement comprises a coupling switch which is open to prevent changes in gate-source voltage of the first output transistor being coupled to the second output transistor when these changes do not relate to a current sampled by the first output transistor, and the coupling switch is closed to transfer the gate voltage to the first transistor gate-source capacitance.

The circuit can then further comprise a second transistor gate-source capacitance.

The circuit is preferably operable in three modes. In a current sampling mode, the first output transistor samples a current and the gate-source voltage is stored on the second transistor gate-source capacitance. In a transfer mode, the gate voltage of the first output transistor is transferred to the first transistor gate-source capacitance by the coupling switch. In an output mode, the second output transistor provides an output current derived from the voltage on the first transistor gate-source capacitance.

In another implementation, the first output transistor is part of a first amplifier. The second output transistor is part of a second amplifier coupled in parallel with the first amplifier. The switch arrangement comprises output switches for each of the first and second amplifiers to selectively couple an amplifier output of each of the first and second amplifiers to the common output. The switch arrangement comprises a feedback switch between the common output and an input and to the first and second amplifiers, and an input switch between a circuit input and the input and to the first and second amplifiers. In this case, the circuit is operable in three modes. In a reset mode, the feedback switch and the output switches are open, and the input switch is closed. In a first output mode, the first amplifier provides the output signal to the common output, the feedback switch is closed, and the input switch is open. In a second output mode, the second amplifier provides the output signal to the common output, the feedback switch is closed, and the input switch is open.

The invention also provides a transistor circuit control method, comprising: coupling an output of a first output transistor to a common output; coupling an output of a second output transistor to the common output, wherein when the output of the first output transistor is coupled to the common output, changes in drive conditions of the first output transistor are isolated from the second output transistor; and wherein the first and second output transistors are controlled to provide the same steady state output.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The invention provides a transistor circuit and control method in which the output is provided by a first output transistor then a second output transistor. When the output of the first output transistor is coupled to the common output, changes in gate-source voltage of the first output transistor are isolated from the second output transistor. However, the first and second output transistors are controlled to provide the same steady state output. Changes in transistor drive voltages which do not relate to the control input (for example relating to a reset operation) are only applied to the first output transistor.

The invention will first be described using an example of application of the invention to a current sampling circuit and method. A first, current sampling, transistor is used for sampling a current, and a second, current output, transistor is in parallel with the first transistor. In this case, changes in gate-source voltage which do not relate to the sampled current are only applied to the first transistor. Only a stabilised gate voltage of the first transistor is transferred to the second transistor, so that transient response delays are avoided for the second transistor.

Figure 5:
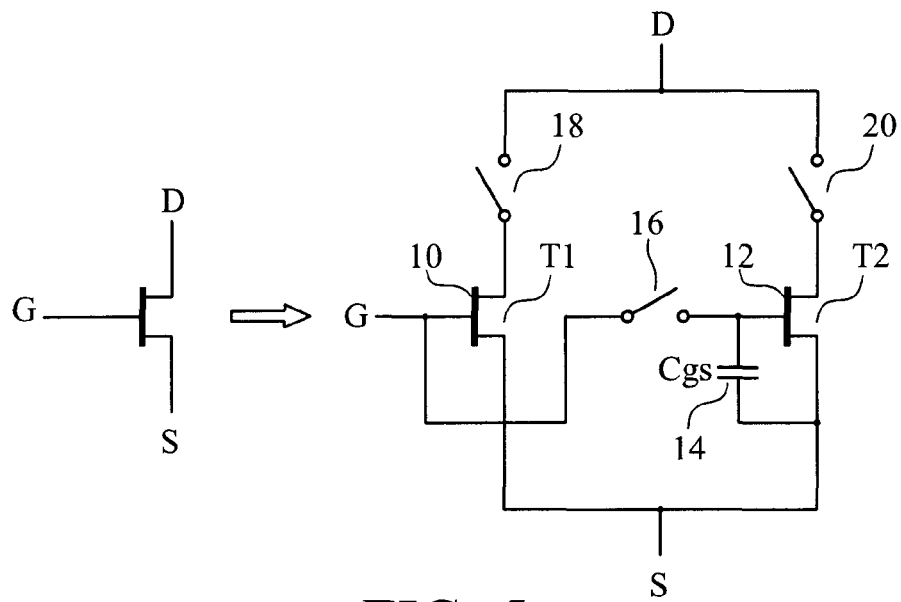
FIG. 5 shows one example of possible arrangement of transistors for implementing the method of the invention.

An example of transistor arrangement which can be used as part of a current sampling circuit of the invention is shown in FIG. 5. The transistor shown on the left of the figure is replaced by the arrangement of transistors and switches shown on the right. The switches represent individual transistors or CMOS transmission gates.

The circuit comprises a first (current sampling) transistor 10 (T1) for sampling a current and a second (current output) transistor 12 (T2) in parallel with the first transistor 10. A gate-source voltage storage capacitor 14 (Cgs) is provided for storing the gate-source voltage of the second transistor 12.

A coupling switch 16 is provided for selectively coupling the gate voltage of the first transistor 10 to the gate of the second transistor 12.

The two transistors 10 and 12 are connected between power rails "drain (D)" and "source (S)". Each transistor 10 and 12 has an associated series switch 18/20, so that each transistor can be switched in or out of circuit.

When the coupling switch 16 is open, this prevents changes in gate-source voltage on the first transistor 10 being coupled to the second transistor 12. This is useful when these voltage changes do not relate to the sampled current, but instead relate to a reset operation of the circuit. The coupling switch 16 is closed to transfer a gate voltage to the capacitor 14.

The circuit is operable in three modes:
- a current sampling mode in which the first transistor 10 samples a current and a gate-source voltage is stored;
- a transfer mode in which the gate voltage of the first transistor 10 is transferred to the gate of the second transistor 12 by the coupling switch 16; and
- an output mode in which the second transistor 12 provides an output current derived from the voltage on the storage capacitor 14.

When the circuit is operating in the first mode (current sampling mode), the gate-source voltage of the transistor is expected to change significantly. The first transistor 10 provides the drain current. The switch 18 is closed and the switches 16 and 20 are open. In this state, the gate-source voltage of the second transistor 12 is maintained by the capacitor 14 (which may be a real capacitor or may simply be the self capacitance of the second transistor 12).

When the circuit is operating in a mode in which the changes in gate-source voltage are more limited or only result from changes in the signal which is being processed by the circuit, then the second transistor 12 can provide the drain current. In this mode, the switch 18 is open and the switches 16 and 20 are closed.

In this way, it is possible to operate the circuit so that the second transistor 12 only experiences significant changes in gate-source voltage corresponding to changes in the signal being processed. This mode of operation corresponds to the output mode outlined above.

The characteristics of the transistors 10 and 12 are nominally the same, but the drain current of the first transistor 10 may be significantly modified by the slow transient effects whereas the drain current of the second transistor 12 is largely free of the slow transient behaviour.

A key application of the proposed method is to circuits that have TFTs operating in the sub-threshold region, especially circuits used to sample very low currents. The idea is to transfer the gate-source voltage from the sampling transistor, which has sampled the current and is experiencing the slow transient effect, to the output transistor that has not experienced a large change of gate-source voltage and therefore does not show the slow transient effect.

Figure 6:
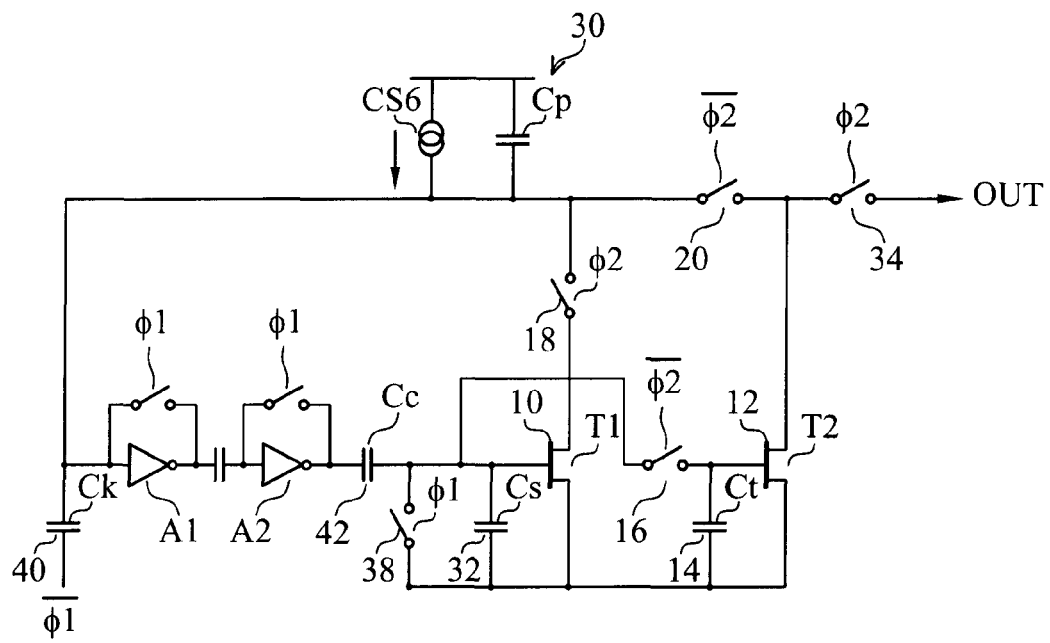
FIG. 6 shows a current sampling circuit that makes use of the proposed method.
Figure 7:
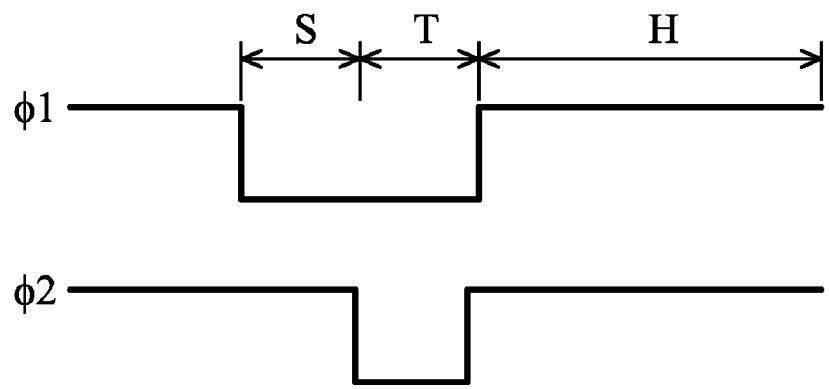
FIG. 7 shows the control signal timing for the circuit of FIG. 6.

An example of a current sampling circuit using the invention is shown in FIG. 6 and possible control signal timing is shown in FIG. 7.

The current (photocurrent) to be sampled is generated by a photodiode 30 which in FIG. 6 is represented by a current source CS6 and a parallel capacitor Cp.

The current is sampled and held by the combination of transistors 10 and 12. Two CMOS inverters A1 and A2 amplify the error voltage which is generated in response to the difference between the photocurrent and the drain current of the transistor 10 or 12. This amplification reduces the settling time of the circuit.

The circuit has a number of switches for controlling the different modes of operation. These include a first set of switches with timing control signals $\phi 1$. One is a reset switch 38 for shorting a gate-source voltage capacitor 32 (Cs) associated with the first transistor 10. The inverters A1 and A2 also include bypass switches with the same timing, used to reset the feedback control loop (which comprises the amplifier chain).

A second set of switches has timing control signals $\phi 2$. One is a switch for placing the first transistor 10 in or out of circuit (switch 18), and another is an output switch 34. The coupling switch 16 is controlled with a timing control signal $\overline{\phi 2}$ opposite to the timing control signals $\phi 2$. The switch 20 for switching the second transistor 12 into circuit is also controlled with timing $\overline{\phi 2}$ (i.e. the complementary signal of $\phi 2$).

The feedback control loop includes a capacitor 40 (Ck) which couples a voltage with a timing control signal $\overline{\phi 1}$ (i.e. the complementary signal of $\phi 1$) to the input of the amplifier chain. As explained below, this makes sure than a positive voltage is applied to the gates of the transistors during the sampling phase. The amplifier chain has an output capacitor 42 (Cc). The capacitors of the amplifier chain store offset voltages, and these are reset as part of the sampling operation, as the charges on these capacitors will dissipate over time.

As shown in FIG. 7, initially the control signals $\phi 1$ and $\phi 2$ are high. The gate-source voltage of the first transistor 10 is set to 0V as a reset operation, and the switches across the inverters A1 and A2 are closed so that the threshold voltage of the inverters is established at their input and output nodes. This represents a reset of the feedback loop.

During a sampling period (S) of approximately 50 µs, the control signal $\phi 1$ goes low and the control signal $\phi 2$ remains high.

The capacitor 40 causes the voltage at the input of the inverter A1 to increase by a small amount which in turn causes a positive going step in voltage at the gate of the first transistor 10. This is preferable to the voltage at the gate of the first transistor 10 remaining at 0V or going negative, as if this were to happen the settling time of the sampling circuit would become limited by the photocurrent and the capacitance of the photodiode.

During the sampling period, the feedback operates to control the gate-source voltage of the first transistor 10, such that the drain current becomes equal to the photocurrent (the amplifiers in the feedback chain draw negligible current at their input). However, the initial step and subsequent control of the gate-source voltage of the first transistor 10 can induce in this device the transient behaviour described previously.

Whilst the feedback is active, it compensates for the transient current by adjusting the value of the gate-source voltage. However, if the photocurrent is sampled by the first transistor 10 and then held by maintaining the gate-source voltage of this device at a constant value, then over time the value of drain current would change as it moved towards a steady state value corresponding to the gate-source voltage. The error in the sampled current would increase at the end of the sampling operation after the feedback loop was opened.

In order to avoid this effect, once the gate-source voltage has been established at the gate of the first transistor 10, this voltage is transferred to the gate of the second transistor 12, which does not experience the initial step in the gate voltage seen by the first transistor 10, and therefore does not display the resulting slow change in drain current. This transfer is achieved by taking the control signal $\phi 2$ and keeping the control signal $\phi 1$ low (i.e. during a transferring period (T) of approximately 50 µs).

The coupling switch 16 between the gates of the two transistors 10 and 12 closes and charge sharing initially takes place between capacitors 14/32 and the output capacitor 42 of the amplifier arrangement. At the same time, the switch 18 in series with the drain of the first transistor 10 opens, and the switch 20 in series with the drain of the second transistor 12 closes, so that the second transistor 12 becomes connected into the feedback loop.

The feedback then operates to adjust the gate-source voltage of the second transistor 12 until the drain current of the second transistor 12 is equal to the photocurrent.

Thus, there is effectively a second sampling phase using the second transistor 12, as part of the transfer period.

At the end of the transfer period, the control signals φ1 and φ2 go high (i.e. entering a holding period (H)), the gate of the second transistor 12 becomes isolated and the gate-source voltage is maintained by the capacitor 14. The drain current of the second transistor 12 is then supplied to the output OUT of the current sampling circuit.

The proposed method can be applied to TFT circuits where errors can result from the slow transient behaviour of the drain current of the devices resulting from changes of gate voltage.

The circuit given as an example is of particular interest in sensor applications, especially when sensing small currents related to e.g. light intensity or temperature. It may also be applicable to other circuits where TFTs experience gate voltage transients and are then required to generate a well defined drain current, for example circuits in which pre-charging techniques are used.

The invention can for example be used in display devices for processing light sensor signals. By way of example only, light sensing can be used to control a display automatically in dependence on the ambient light level, and such control schemes are known. Light sensing can also be used to characterize the ageing of a light source, such as a backlight, or indeed display pixels themselves, for example in electroluminescent displays.

Another application of the invention is to amplifier or buffer circuits.

Figure 8:
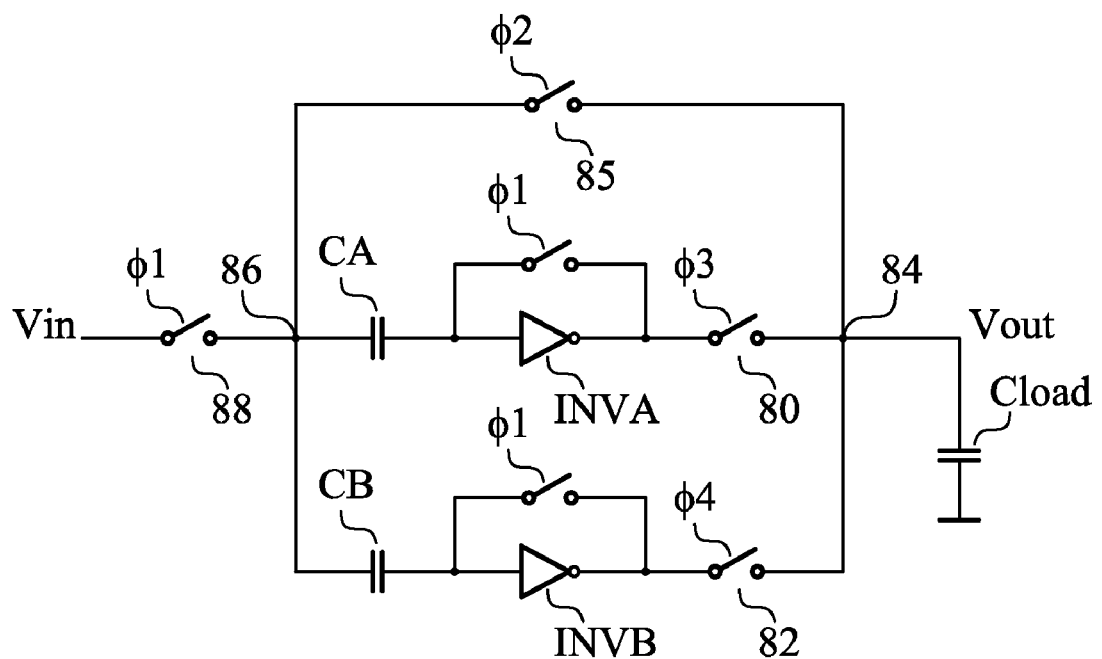
FIG. 8 shows a voltage amplification circuit that makes use of the proposed method.

FIG. 8 shows a voltage amplification circuit that makes use of the proposed method; and which again provides the advantage of reducing the slow transient errors.

There are two inverting voltage amplifiers, INVA and INVB, arranged in such a way that they operate as unity gain amplifiers, i.e. the output voltage Vout is equal to the input voltage Vin, after the feedback has operated. Of course this is merely an example in which the amplifiers function as buffers, but the same principles apply to amplifying circuits.

A switch arrangement comprises output switches 80 and 82 for each amplifier selectively coupling the amplifier output to a common output 84. A feedback switch 85 is connected between the common output 84 and an input 86 and to the first and second amplifiers. An input switch 88 is provided between a circuit input Vin and the input 86 and coupled to the first and second amplifiers.

Each amplifier has a feedback switch for shorting the input and output, and this is used to force the threshold voltage of the amplifier to be present between the input and output. Each amplifier also has a capacitor CA/CB at its input.

Figure 9:
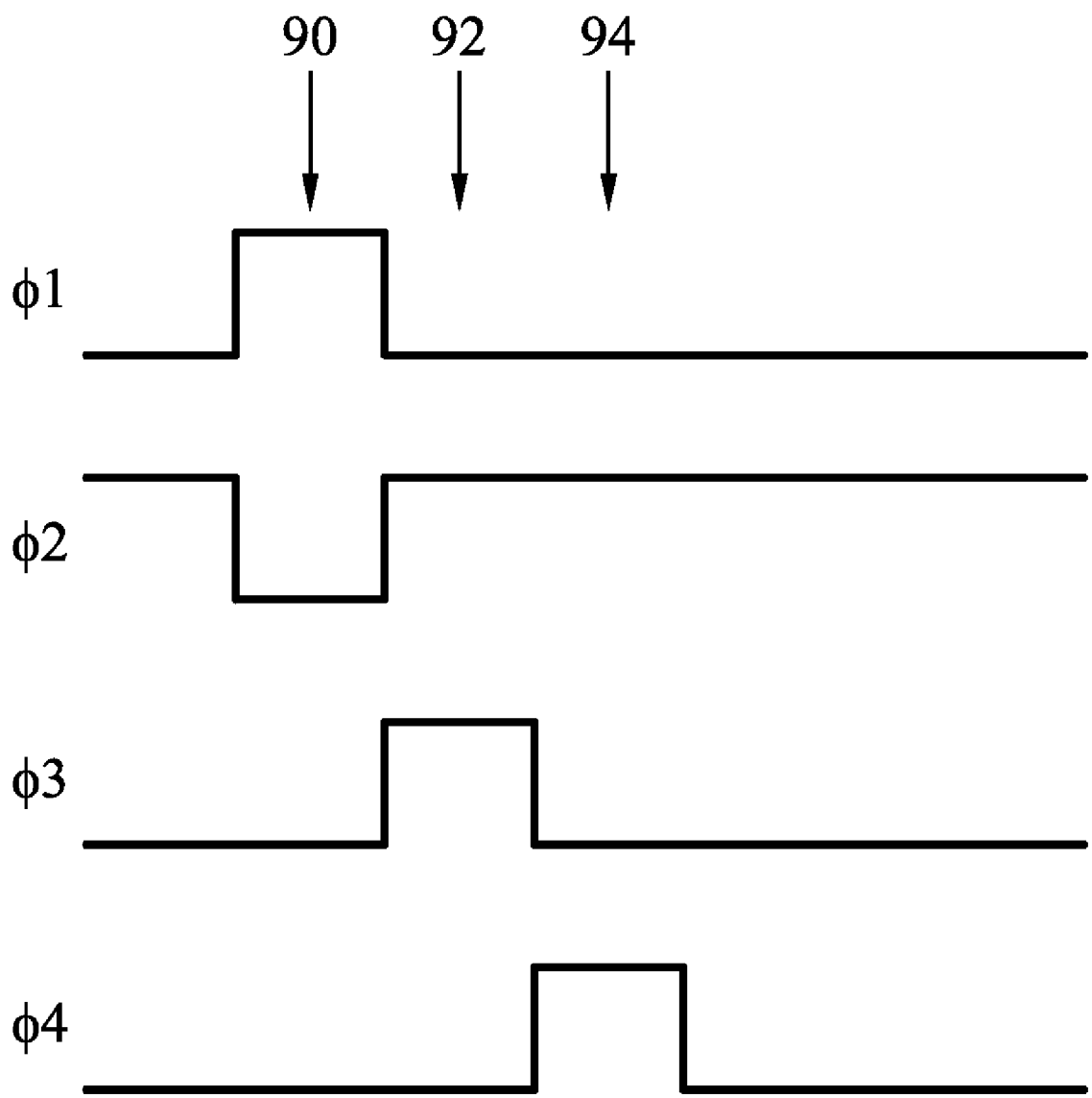
FIG. 9 shows the control signal timing for the circuit of FIG. 8.

The timing of the various switches is shown, as signals φ1 to φ4, and the timing is shown in FIG. 9.

During a first phase of operation 90, which can be a reset phase, the signal φ1 is high, so that the input voltage is provided to the two amplifiers. The signals φ2, φ3, and φ4 are low. Across the capacitor CA, a voltage equal to VthA-Vin is established, whereas across the capacitor CB a voltage VthB-Vin is established, where VthA and VthB are the threshold voltages of amplifiers INVA and INVB respectively.

The threshold voltages VthA and VthB can be assumed to be 2.5V if the supply voltage is 5V.

In a second phase of operation 92, which is a first feedback phase, the signals φ1 and φ4 are low, whereas the signals φ2 and φ3 are high. This means than the amplifier INVA is operating in the feedback mode and initially its input will be:

$$VthA+VthB-Vin=5-Vin.$$

If for example Vin is 4 V, then the input of the amplifier INVA is 1V, which means that the TFTs forming the amplifier INVA will experience a step in gate voltage from approximately 2.5V to 1V.

Figure 1:
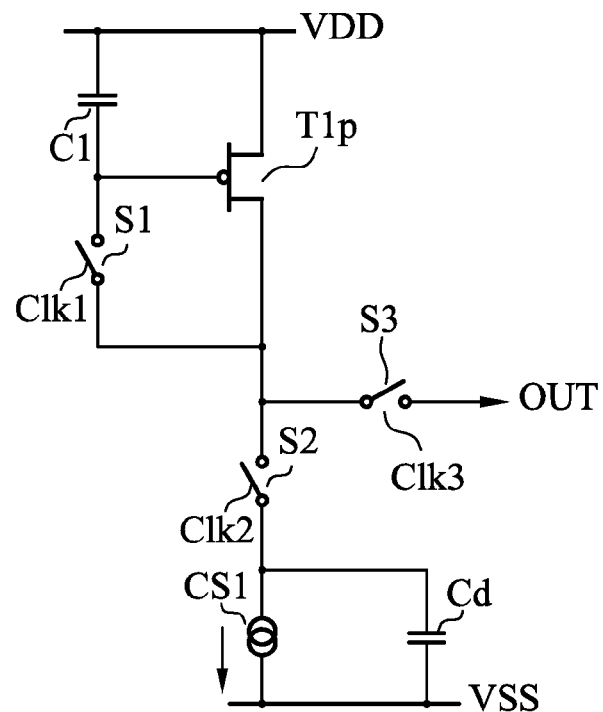
FIG. 1 shows a known current sampling circuit.
Figure 2:
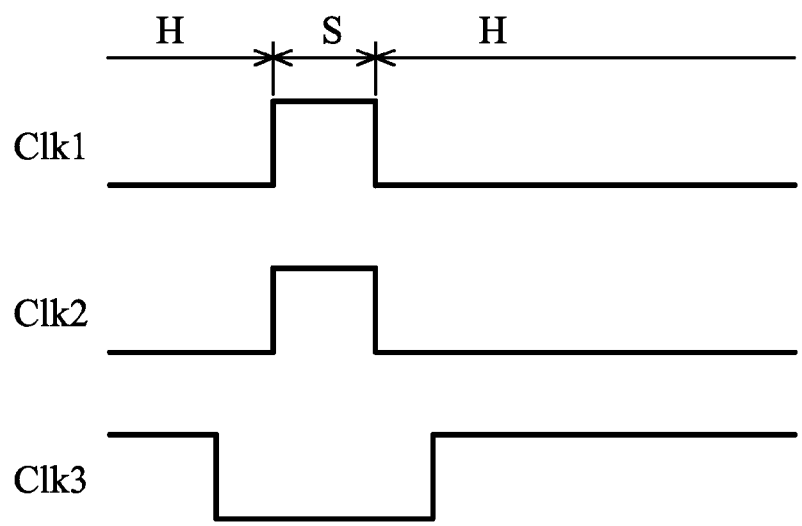
FIG. 2 is a timing diagram to explain the operation of the circuit of FIG. 1.
Figure 3:
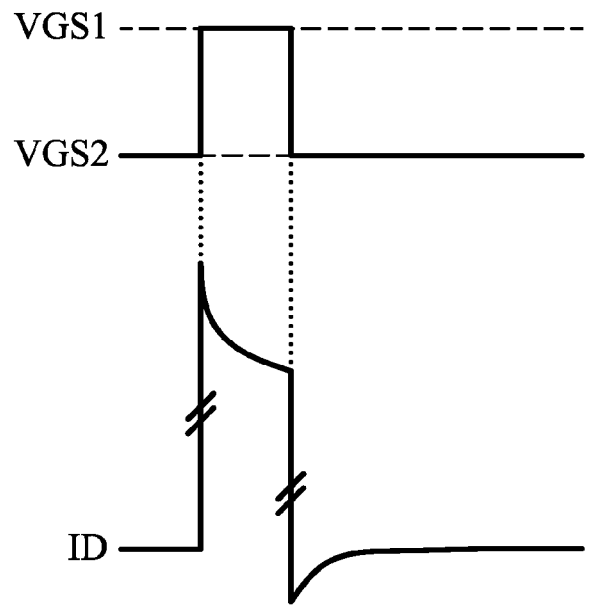
FIG. 3 shows the current overshoot or undershoot which can be seen in TFT behaviour.
Figure 4:
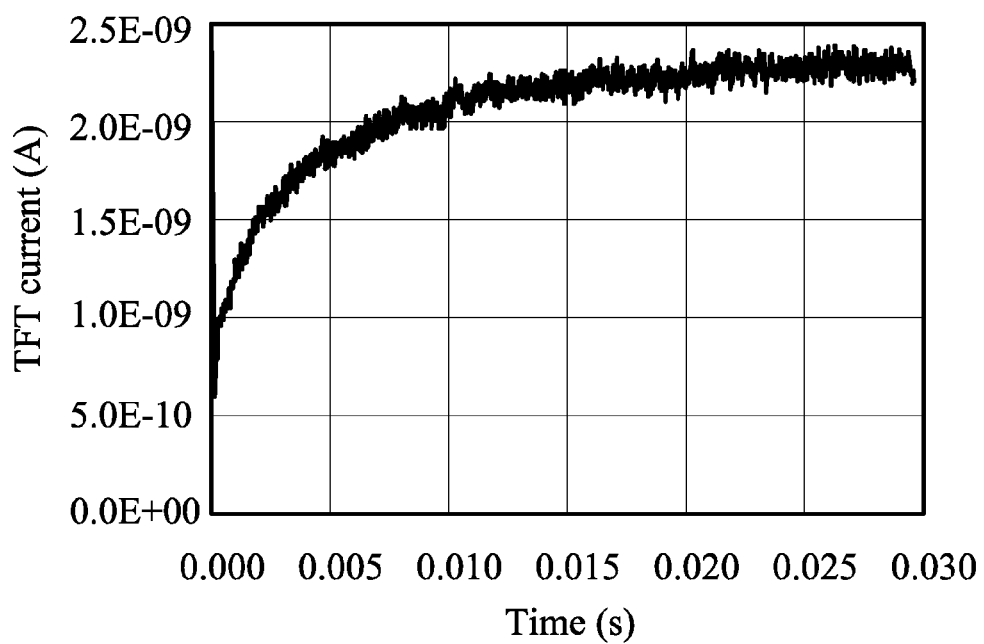
FIG. 4 shows an example of the drain current transient behaviour measured in an n-type LTPS TFT.

This step is likely to induce a slow transient as described in connection with FIG. 3, which means that it will be needed to wait several milliseconds (depending on the gain of the amplifier) before the output voltage Vout becomes equal to Vin.

In a third phase 94, which is a second feedback phase, the signal φ4 goes high and the signal φ3 goes low. The amplifier INVA is disconnected from the feedback loop, and the amplifier INVB will be operated in the feedback mode. In this phase, the TFTs in the amplifier INVB will experience a reduced step in voltage compared to the one experienced by the TFTs in INVA when the signal φ3 was high, since the output voltage Vout will have already gone through some of the transient when signal φ3 was high.

Thus, it will be seen that the invention enables an output from a transistor circuit (whether voltage or current) to be provided by two different transistors or transistor circuits in sequence. Both transistors or transistor circuits are controlled so that they are driven to provide the same output. However, only the first transistor or transistor circuit in the sequence experiences fully the changes in drive conditions between the output cycles, for example which may result from a reset phase.

The circuits shown are only isolated examples, and there are many other current sensing circuits and amplification circuits known to those skilled in the art. Furthermore, the invention applies more generally to output circuits for providing current or voltage output from an output transistor, in response to input conditions.

The switches shown in the circuit can of course be implemented with individual transistors or transistor gate circuits, and if the circuit is to be integrated onto the substrate of another device (such as a display), the same technology devices will be used for the switches as for the other circuit elements on the substrate. The implementation of the circuit shown will therefore be routine to those skilled in the art.

Generally, the invention can be applied in a circuit in which the circuit undergoes a periodic reset or pre-charge operation, which results in transistor gate voltage changes which are not derived from a change in the control input. The approach of the invention provides an output transistor which is isolated from these changes, so that slow transient response is avoided for that output transistor (unless this is the result of large changes in current being sampled).

In the description and claims, it will be understood that a reference to a gate-source capacitance can comprise a self capacitance of a transistor or it can refer to an additional capacitor in the transistor circuit which can store a gate-source voltage.

Various modifications will be apparent to those skilled in the art.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A transistor circuit, comprising:
   a first output transistor;
   a second output transistor, wherein the first and second output transistors are arranged to provide an output signal to a common output of the transistor circuit; and
   a switch arrangement coupling an output of the first output transistor and an output of the second output transistor to the common output in sequence, wherein the first and second output transistors are controlled to provide the same steady state output;
   wherein the switch arrangement is adapted such that when the output of the first output transistor is coupled to the common output, changes in drive conditions voltage of the first output transistor are isolated from the second output transistor, and
   wherein the transistor circuit comprises a current sampling circuit, wherein:
      the first output transistor comprises a current sampling transistor sampling a current,
      the second output transistor comprises a transistor delivering a current output, and the second output transistor is coupled in parallel with the first output transistor,
      the transistor circuit further comprises a first transistor gate-source capacitance,
      the switch arrangement is selectively coupling a gate voltage of the first output transistor to a gate of the second output transistor, and
      the switch arrangement comprises a coupling switch which is open to prevent changes in gate-source voltage of the first output transistor being coupled to the second output transistor when these changes do not relate to the current sampled by the first output transistor, and the coupling switch is closed to transfer the gate voltage to the first transistor gate-source capacitance.

2. The circuit as claimed in claim 1, further comprising a second transistor gate-source capacitance.

3. The circuit as claimed in claim 2, wherein the transistor circuit is operable in three modes:
   a current sampling mode in which the first output transistor samples the current and the gate-source voltage is stored on the second transistor gate-source capacitance;
   a transfer mode in which the gate voltage of the first output transistor is transferred to the first transistor gate-source capacitance by the coupling switch; and
   an output mode in which the second output transistor provides an output current derived from the voltage on the second transistor gate-source capacitance.

4. The circuit as claimed in claim 3, wherein in the transfer mode, the current is further sampled by the second output transistor.

5. The circuit as claimed in one of claims 2, further comprising a reset switch shorting the second transistor gate-source capacitance.

6. The circuit as claimed in claim 1, wherein:
   the first output transistor is part of a first amplifier;
   the second output transistor is part of a second amplifier coupled in parallel with the first amplifier; and
   the switch arrangement comprises output switches for each of the first and second amplifiers to selectively couple an amplifier output of each of the first and second amplifiers to the common output.

7. The circuit as claimed in claim 6, wherein the switch arrangement comprises a feedback switch between the common output and an input and to the first and second amplifiers, and an input switch between a circuit input and the input and to the first and second amplifiers.

8. The circuit as claimed in claim 7, wherein the transistor circuit is operable in three modes:
   a reset mode in which the feedback switch and the output switches are open, and the input switch is closed;
   a first output mode in which the first amplifier provides the output signal to the common output, the feedback switch is closed, and the input switch is open; and
   a second output mode in which the second amplifier provides the output signal to the common output, the feedback switch is closed, and the input switch is open.

9. The circuit as claimed in claim 7, wherein the first and second output transistors comprise thin film CMOS low temperature polysilicon transistors.

10. The circuit as claimed in claim 1, wherein the first and second output transistors comprise thin film CMOS low temperature polysilicon transistors.

11. The circuit as claimed in claim 1, wherein the switch arrangement couples by switching the output of the first output transistor and the output of the second output transistor to the common output in sequence with respect to time.

12. A transistor circuit control method, comprising:
    coupling an output of a first output transistor to a common output; and
    coupling an output of a second output transistor to the common output, wherein the output of the first output transistor and the output of the second output transistor are coupled to the common output in sequence;
    wherein when the output of the first output transistor is coupled to the common output, changes in drive conditions of the first output transistor are isolated from the second output transistor, and wherein the first and second output transistors are controlled to provide the same steady state output, and
    wherein the transistor circuit control method comprises a current sampling method, comprising:
       using the first output transistor to sample a current, and storing a gate-source voltage of the first output transistor on a first transistor gate-source capacitance, wherein changes in the gate-source voltage are isolated from the second output transistor when these changes do not relate to the sampled current,
       transferring a gate voltage of the first output transistor to a second transistor gate-source capacitance, and
       using the second output transistor to provide an output current derived from the voltage on the second transistor gate-source capacitance.

13. The method as claimed in claim 12 further comprising shorting the first transistor gate-source capacitance during a reset operation between current sampling timings.

14. The method as claimed in claim 12 further comprising when the gate voltage of the first output transistor is transferred, using the second output transistor to sample the current and storing a gate-source voltage of the second output transistor on the second transistor gate-source capacitance.

15. The method as claimed in claim 14 further comprising shorting the first transistor gate-source capacitance during a reset operation between current sampling timings.

16. A method as claimed in claim 12 further comprising a voltage amplification method, wherein the first output transistor is part of a first amplifier; and the second output transistor is part of a second amplifier coupled in parallel with the first amplifier.

17. The method as claimed in claim 12, wherein the output of the first output transistor and the output of the second output transistor are coupled by switching the output of first output transistor and the second output transistor to the common output in sequence with respect to time.

* * * * *